United States Patent
Dantoni et al.

(10) Patent No.: US 11,329,687 B2
(45) Date of Patent: May 10, 2022

(54) TRANSCEIVER CIRCUIT WITH DIGITAL PRE-DISTORTION (DPD) OPTIONS

(71) Applicant: TEXAS INSTRUMENTS INCORPORATED, Dallas, TX (US)

(72) Inventors: Francesco Dantoni, Rome (IT); Jawaharlal Tangudu, Bengaluru (IN); Sarma Sundareswara Gunturi, Bengaluru (IN); Robert Clair Keller, Friedrichshafen (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/983,719

(22) Filed: Aug. 3, 2020

(65) Prior Publication Data

US 2021/0226660 A1 Jul. 22, 2021

Related U.S. Application Data

(60) Provisional application No. 62/963,194, filed on Jan. 20, 2020.

(51) Int. Cl.
*H04B 1/00* (2006.01)
*H04L 25/03* (2006.01)
(Continued)

(52) U.S. Cl.
CPC ............ *H04B 1/40* (2013.01); *H03F 1/3241* (2013.01); *H03F 3/245* (2013.01); *H03F 2200/294* (2013.01); *H03F 2200/451* (2013.01); *H03F 2201/3215* (2013.01); *H04B 1/005* (2013.01); *H04L 25/03343* (2013.01)

(58) Field of Classification Search
CPC .. H03F 2200/451; H03F 3/245; H03F 1/0288; H03F 3/24; H03F 3/193; H03F 3/211; H03F 1/3247; H03F 2200/102; H03F 2200/18; H03F 3/195; H03F 3/213; H03F 1/0211; A61B 90/361; A61B 2017/00477; A61B 34/25; A61B 34/30; A61B 2018/1253; A61B 2018/126; A61B 2034/2055; A61B 34/20; A61B 90/37; A61B 2017/00199; A61B 2017/00221; H04L 27/368; H04L 25/03343; H04L 27/2614; H04L 25/03834; H04L 25/0224; H04L 25/03828; H04L 27/01;
(Continued)

(56) References Cited

U.S. PATENT DOCUMENTS

2007/0249290 A1* 10/2007 Jorgensen ............ H03F 1/3247
455/73
2009/0072900 A1* 3/2009 Park ........................ H03F 3/24
330/149
(Continued)

*Primary Examiner* — Eva Y Puente
(74) *Attorney, Agent, or Firm* — John R. Pessetto; Charles A. Brill; Frank D. Cimino

(57) ABSTRACT

A system includes: a host processor; a transceiver coupled to the host processor; and a power amplifier coupled to an output of the transceiver. The transceiver includes a transmit chain with digital pre-distortion (DPD) logic configured to: perform DPD correction operations on transmit data received by the transmit chain; and output corrected transmit data based on the performed DPD correction operations, wherein the output corrected transmit data is provided to the power amplifier.

11 Claims, 8 Drawing Sheets

(51) Int. Cl.
  *H04B 1/40*   (2015.01)
  *H03F 3/24*   (2006.01)
  *H03F 1/32*   (2006.01)

(58) Field of Classification Search
  CPC ............ H04L 27/2618; H04L 27/2624; H04L 27/3405; H04L 27/367
  USPC ............................................. 375/219; 455/73
  See application file for complete search history.

(56) References Cited

U.S. PATENT DOCUMENTS

2019/0222179 A1*  7/2019  Doi ...................... H03F 1/3282
2019/0372530 A1* 12/2019  Stewart ................. H04B 1/525
2020/0052659 A1*  2/2020  Kim ...................... H03F 3/245

* cited by examiner

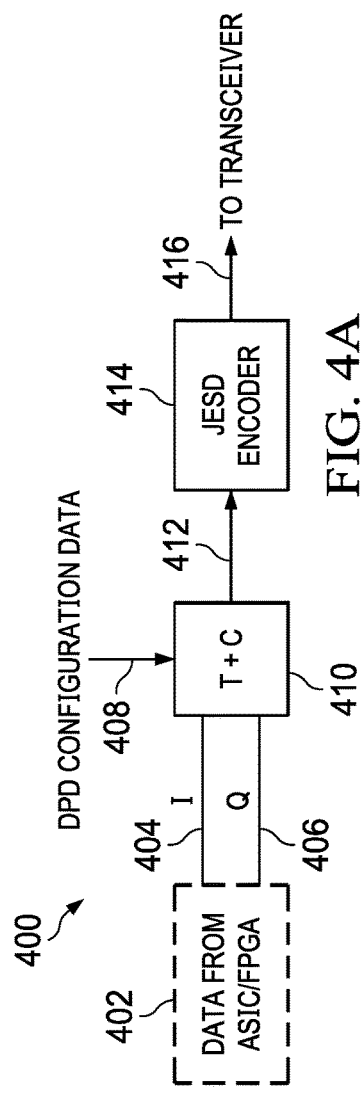
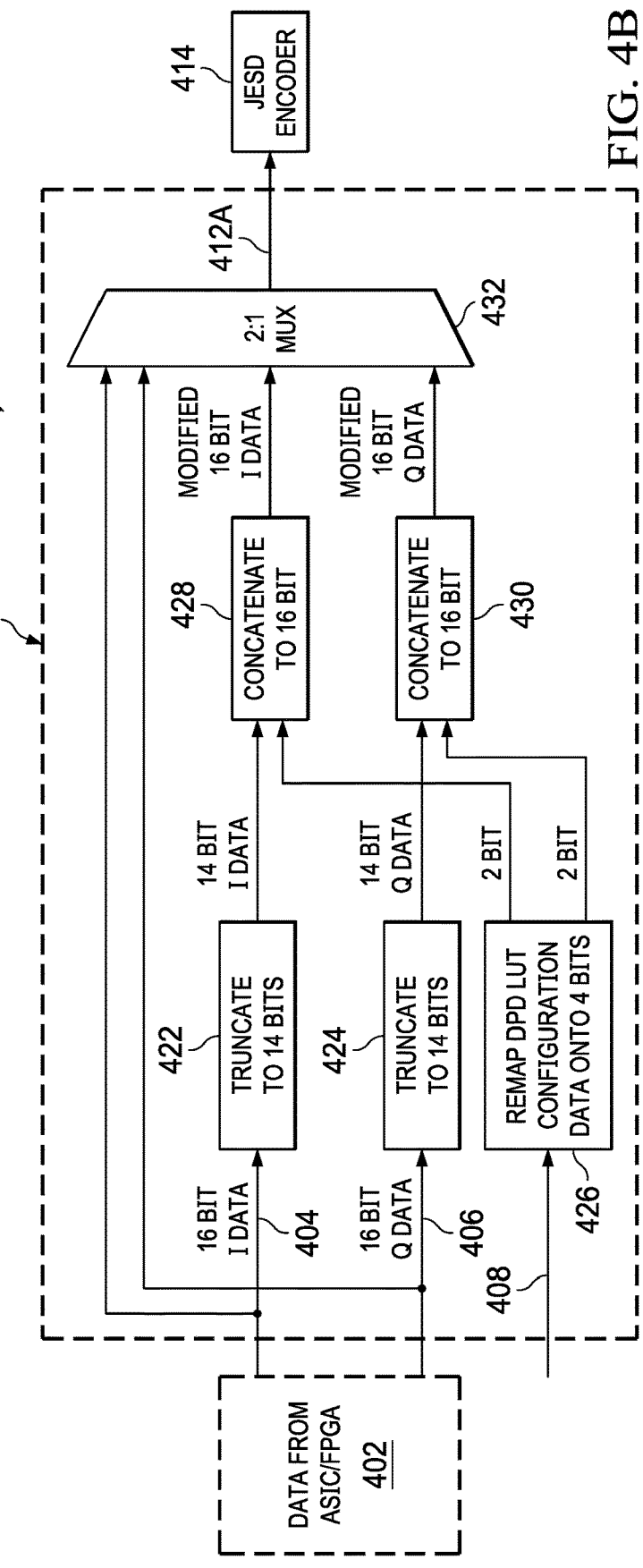
FIG. 4A
FIG. 4B

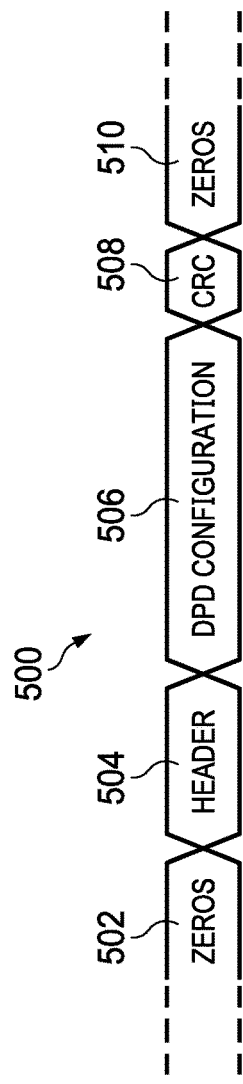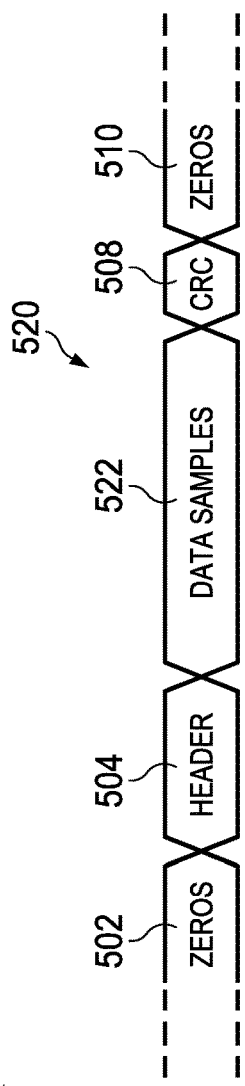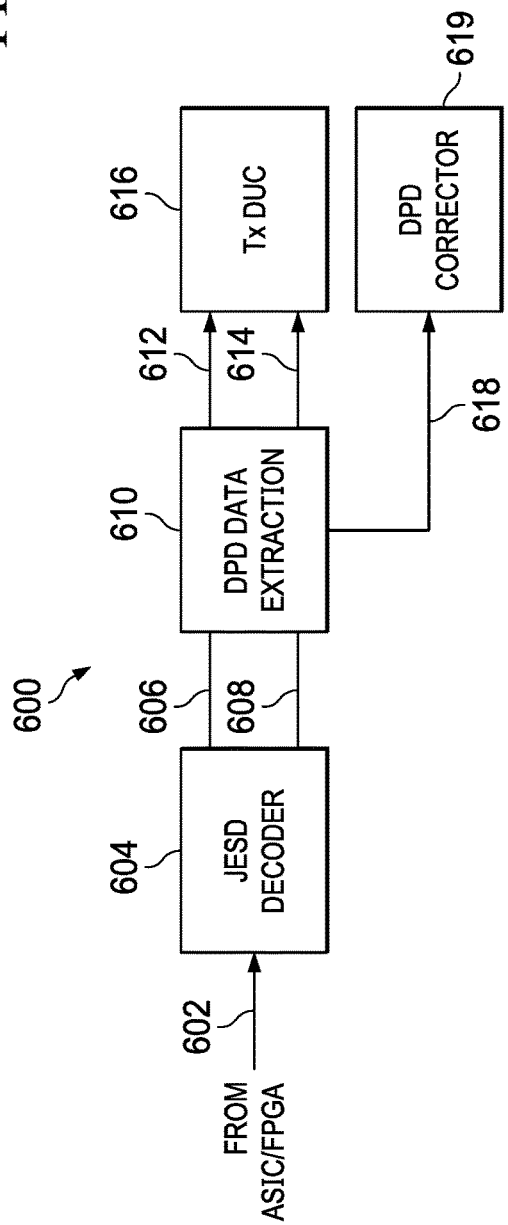

TRANSCEIVER CIRCUIT WITH DIGITAL PRE-DISTORTION (DPD) OPTIONS

CROSS-REFERENCE TO RELATED APPLICATION

This application claim priority to U.S. Provisional Application No. 62/963,194, filed Jan. 20, 2020, titled "High Speed Transfer of DPD Data Between Transceiver Chip to DPD Estimator Chip," which is hereby incorporated herein by reference in its entirety.

BACKGROUND

The proliferation of electronic devices and integrated circuit (IC) technology has resulted in the commercialization of IC products. As new electronic devices are developed and IC technology advances, new IC products are commercialized. One example IC product that is needed in electronic devices is a transceiver. An example transceiver is used in a wireless base station, where the transmit chain of the transceiver is coupled to a power amplifier (PA) to amplify the signal to a target output power (e.g., 1 W to 20 W). Pas have significant non-linearity as high as −20 dBc, which leads to out of band emissions and in-band signal distortion.

In order to improve non-linearity and efficiency of PAs, digital pre-distortion (DPD) algorithms have been used, where the DPD algorithms pre-distort the transmit baseband signal so that the output from the PA is more linear. Over time, the DPD algorithms used for DPD correction operations need to be updated to account for changes. The update of DPD algorithms involves a large amount of data. DPD correction operations also represent a large amount of processing. As the number of transmit chains and antennas increase in a system (e.g., a base station), performing DPD update and correction operations involves an increasing amount of power, power dissipation, and latency issues.

SUMMARY

In accordance with at least one embodiment of the description, a system comprises: a host processor; a transceiver coupled to the host processor; and a power amplifier coupled to an output of the transceiver. The transceiver is configured to: perform DPD correction operations on transmit data received by the transmit chain; and output corrected transmit data based on the performed DPD correction operations. The output corrected transmit data is provided to the power amplifier.

In accordance with at least one embodiment of the description, a transceiver circuit comprises a communication interface; an interpolator coupled to the communication interface; and DPD logic coupled to the interpolator. The transceiver circuit also includes a transmit chain coupled to an output of the DPD logic.

In accordance with at least one embodiment of the description, an integrated circuit comprises: a host device terminal; a communication interface coupled to the host device terminal; DPD logic coupled to the communication interface; and a transmit chain coupled to an output of the DPD logic. The DPD logic is configured to: if a DPD bypass indicator has been received, bypass DPD correction operations on transmit data received from the host device terminal; and if a DPD bypass indicator has not been received, perform DPD correction operations on transmit data received from the host device terminal.

BRIEF DESCRIPTION OF THE DRAWINGS

FIGS. 4A-4C are diagrams showing digital pre-distortion (DPD) configuration profile data encoding options in accordance with example embodiments.

FIG. 5A is a diagram showing a frame structure for data transfers to convey DPD configuration profile data from a host device to a transceiver circuit in accordance with an example embodiment.

FIG. 5B is a diagram showing a frame structure for data transfers to convey data samples from a transceiver circuit to a host device in accordance with an example embodiment.

FIGS. 6A-6C are diagrams showing DPD configuration profile data decoding options in accordance with example embodiments.

DETAILED DESCRIPTION

Figure 1:
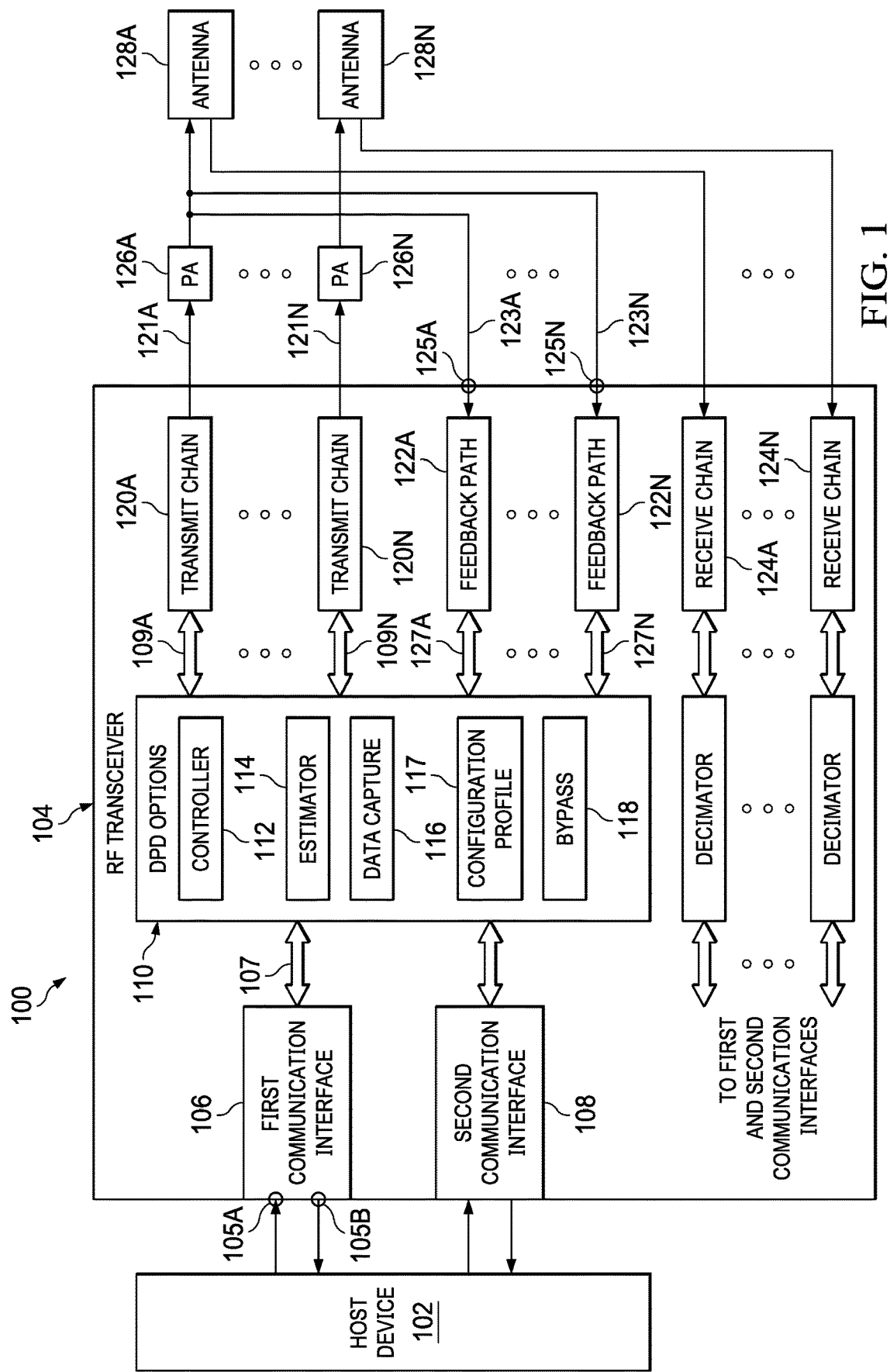
FIG. 1 is a block diagram showing a system in accordance with an example embodiment.

Described herein is a transceiver circuit with digital pre-distortion (DPD) options. In some example embodiments, the described transceiver circuit is part of a communication system (e.g., a base station or other wireless communication link) with a host device or processor, the transceiver circuit, a power amplifier, and an antenna, where the DPD options of the transceiver circuit facilitate compatibility with different host devices and improve power amplifier (PA) output linearity and efficiency.

In some examples, a host device is configured to provide transmit data to a transmit chain of the transceiver circuit and/or to handle receive data provided from a receive chain of the transceiver circuit. In one example scenario, a host device is configured to perform DPD estimation operations and to provide updates (e.g., a DPD configuration profile) to the transceiver circuit, which performs DPD correction operations on transmit data. In this scenario (where different DPD operations are performed by the host device and by the transceiver circuit), a significant amount of data needs to be transferred between the host device and the transceiver circuit, resulting in latency issues for DPD updates. One type of data transfer that is needed in this scenario involves transferring updated DPD configuration data (e.g., a DPD configuration profile in the form a different look-up tables or LUTs) from the host device to the transceiver circuit as noted above. Another type of data transfer that is needed in this scenario involves transferring data samples (e.g., data samples from a power amplifier output, data samples before DPD correction, and data samples after DPD correction) from the transceiver circuit to the host device, where the data samples are used by the host device to perform DPD estimation operations. Both of these data transfers increase the latency of DPD updates, which can result in higher non-linearity of a PA output, higher PA inefficiency, and increased out-of-band emissions.

To increase the speed of data transfers between the host device and the transceiver circuit, a high-speed communication interface is needed. One available communication interface for DPD-related data transfers between the host device and the transceiver circuit is a serial peripheral interface (SPI). Assuming a speed of 25 MHz, the overhead of using SPI for DPD-related data transfers adds a significant overhead to DPD updates (approximately a 25% overhead). Accordingly, in some example embodiments, a host device and a transceiver use serializer/de-serializer (SERDES) lanes (e.g., part of a JESD interface) for DPD-related data transfers.

In one example, DPD-related data transfers from the host device to the transceiver circuit involve preparing data transfers, by the host device, using truncation and concatenation circuitry to truncate the total number of transmit bits (e.g., from 16 transmit data bits to 14 or less bits for each data transfer) and to concatenate DPD configuration profile bits (e.g., add 2 or more DPD configuration profile bits for each of the data transfers) to replace the truncated transmit bits. In this case, the transceiver circuit is configured to recover the DPD configuration profile from the concatenated bits included with the data transfers from the host device. Once recovered, the DPD configuration profile is available for use by DPD logic of the transceiver circuit to perform DPD correction operations.

In another example, the transceiver synchronously captures a block of data samples at a feedback receiver output, a block of data samples at a DPD corrector input, and a block data samples at a DPD corrector output. In this example, the captured data samples are transferred to the host device to enable DPD estimation as described herein. DPD-related data transfers from the transceiver circuit to the host device involve preparing data transfers, by the transceiver circuit, using truncation and concatenation circuitry to truncate the total number of receive bits (e.g., from 16 receive data bits to 14 or less for each data transfer) and to concatenate data sample bits (e.g., add 2 or more data sample bits) to replace the truncated receive bits. In this case, the host device is configured to recover the data samples from the concatenated bits included with the data transfers from the transceiver circuit. Once recovered, the data samples are available for use by the host device to perform DPD estimation operations.

In other examples, a transceiver circuit is configured to perform all DPD estimation and DPD correction operations. As another alternative, a host device is able to perform all DPD estimation and DPD correction operations. In such case, the transceiver circuit is able to bypass performing DPD correction operations and/or DPD estimation operations. As another alternative, DPD estimation operations are divided between the host device and the transceiver circuit. As another alternative, DPD correction operations are divided between the host device and the transceiver circuit. As desired, data transfers are prepared using truncation and concatenation as described herein to expedite DPD-related data transfers from the host device to the transceiver circuit and/or from the transceiver circuit to the host device. Another option is to supplement the expedited DPD-related data transfers described herein with SPI data transfers. To provide a better understanding, various transceiver circuit options, DPD options and related systems are described using the figures as follows.

FIG. 1 is a block diagram showing a system 100 in accordance with an example embodiment. In some example embodiments, the system 100 is a base station or other wireless communication device. As shown, the system 100 includes a host device 102 (e.g., a host processor) coupled to a radio frequency (RF) transceiver 104. In the example of FIG. 1, the RF transceiver 104 includes a $1^{st}$ communication interface 106 (e.g., a JESD interface) and a $2^{nd}$ communication interface 108 (e.g., an SPI interface). Specifically, the RF transceiver 104 includes host device terminals 105A and 1056 for communications via the first communication interface 106, where the host device terminal 105A is for receiving data transfers from the host device 102, and where the host device terminal 105B is for sending data transfers to the host device 102. In some example embodiments, the first communication interface 106 is configured to encode data transfers for transmission to the host device 102 from the RF transceiver 104 via the host device terminal 105B. Also, the first communication interface 106 is configured to decode data transfers received from the host device 102 to the RF transceiver 104 via the host device terminal 105B. In some example embodiments, decoded data transfers the include transmit data 107 (e.g., I and Q data) conveyed to DPD options 110 of the RF transceiver 104.

As shown, the DPD options 110 includes a corrector option 112, an estimator option 114, a data capture option 116, a DPD configuration profile 117, and a bypass option 118. In some examples, the DPD options 110 represent circuitry configured to perform the options described herein. More specifically, the corrector option 112 involves performing DPD corrections on transmit data based on the DPD configuration profile 117 (e.g., LUTs). The estimator option 114 involves generating a new DPD configuration profile 117 based on data samples (e.g., data samples before DPD correction operations, data samples after DPD correction operations, and data samples of feedback from a power amplifier output). Once a new DPD configuration profile 117 is available, the corrector option 112 uses the new DPD configuration profile 117 to perform updated DPD correction operations. The data capture option 116 involves data capture operations to obtain data samples (e.g., data samples before DPD correction operations, data samples after DPD correction operations, and data samples of feedback from a power amplifier output). The bypass option 118 involves bypassing one or more of the corrector option 112, the estimator option 114, and/or the data capture option 116.

As shown, the RF transceiver 104 also includes transmit chains 120A-120N coupled to the DPD options 110. When the correction option 112 is used, each of the one or more of the transmit chains 120A-120N is configured to use corrected transmit data 109A-109N to generate analog signals 121A-121N for transmission by PAs 126A-126N external to the RF transceiver 104. Even if the corrector option 112 is not used, the one or more of the transmit chains 120A-120N are able to convey analog signals 121A-121N based on corrected transmit data to one or more PAs 126A-126N, where the DPD correction operations are performed by the host device 102. In one example, the host device 102 is a processor chip, and the RF transceiver 104 is an integrated circuit (IC) separate from the host device 102, the PAs 126A, and the antennas 128A-128N. As shown, the PAs 126A-126N are coupled to the antennas 128A-128N to propagate wireless signals, where DPD operations of the host device 102 and/or the RF transceiver 104 improve PA efficiency, output linearity, and out-of-band emissions.

As shown, the outputs 123A-123N from the PAs 126A-126N are also provided to feedback paths 122A-122N of the RF transceiver 104 via power amplifier terminals 125A-125N configured to receive the outputs 123A-123N. When the data capture option 116 is used, data samples of feedback data 127A-127N from one or more of the feedback paths 122A-122N are captured. In one example, data samples of transmit data 107 before DPD correction operations and data samples of corrected transmit data 109A-109A (after DPD correction operations) are captured when the data capture option 116 is used.

In the example of FIG. 1, the RF transceiver 104 also includes a plurality of receive chains 124A-124N coupled to the antennas 128A-128N, where the outputs of the receive chains 124A-124N are coupled to respective downconverters and decimators 125A-125N. As represented in FIG. 1, the outputs of the decimators 125A-125N are provided to the $1^{st}$ communication interface 106 and/or the $2^{nd}$ communication interface 108.

In one example, DPD-related data transfers from the host device 102 to the RF transceiver 104 involve preparing data transfers, by the host device 102, using truncation and concatenation circuitry to truncate the total number of transmit bits (e.g., from 16 transmit data bits to 14 or less bits for each data transfer) and to concatenate DPD configuration profile bits (e.g., add 2 or more DPD configuration profile bits for each of the data transfers) to replace the truncated transmit bits. In this case, the $1^{st}$ communication interface 106 of the RF transceiver 104 is configured to recover the DPD configuration profile from the concatenated bits included with the data transfers from the host device 102. Once recovered, the DPD configuration profile is available for use by DPD logic of the RF transceiver 104 to perform DPD correction operations.

In another example, DPD-related data transfers from the RF transceiver 104 to the host device 102 involve preparing data transfers, by the $1^{st}$ communication interface 106 of the RF transceiver 104, using truncation and concatenation circuitry to truncate the total number of receive bits (e.g., from 16 receive data bits to 14 or less for each data transfer) concatenate with data sample bits (e.g., add 2 or more data sample bits) to replace the truncated receive bits. In this case, the host device 102 is configured to recover the data samples from the concatenated bits included with the data transfers from the RF transceiver 104. Once recovered, the data samples are available for use by the host device 102 to perform DPD estimation operations.

In other examples, the RF transceiver 104 is configured to perform all DPD estimation and DPD correction operations. As another alternative, the host device 102 is able to perform all DPD estimation and DPD correction operations. In such case, the RF transceiver 104 is able to bypass performing DPD correction operations and/or DPD estimation operations. As another alternative, DPD estimation operations are divided between the host device 102 and the RF transceiver 104. As another alternative, DPD correction operations are divided between the host device 102 and the transceiver circuit 104. As desired, data transfers are prepared using truncation and concatenation as described herein to expedite DPD-related data transfers from the host device 102 to the RF transceiver 104 and/or from the RF transceiver 104 to the host device 102. Another option is to supplement the expedited DPD-related data transfers of the $1^{st}$ communication interface 106 (e.g., a JESD interface) with DPD-related data transfers of the $2^{nd}$ communication interface 108 (e.g., SPI data transfers).

Figure 2:
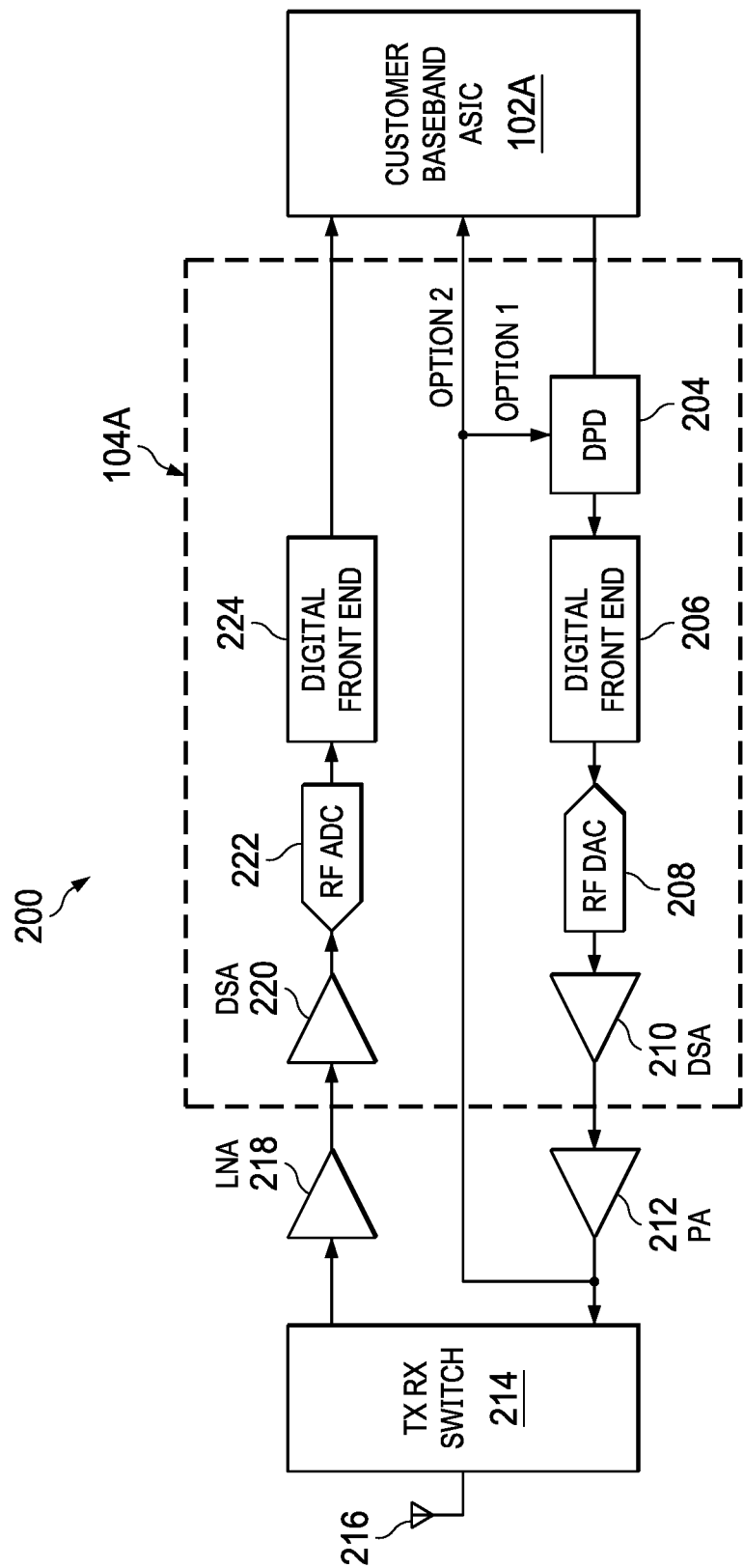
FIG. 2 is a diagram showing another system in accordance with an example embodiment.

FIG. 2 is a diagram showing another system 200 (an example of system 100 in FIG. 1) in accordance with an example embodiment. In some example embodiments, the system 200 is a base station or other wireless communication device. As shown, the system 200 includes a baseband application-specific IC (ASIC) 102A (an example of the host device 102 in FIG. 1). The baseband ASIC 102A is coupled to a transceiver circuit 104A (an example of the RF transceiver 104 in FIG. 1). In the example of the FIG. 2, the transceiver circuit 104A includes a digital front-end 206 with DPD logic 204 configured to perform the DPD options 110 described in FIG. 1. Other example operations of the digital front-end 206 include communication interface operations to expedite data transfers of DPD-related data as described herein. Other operations of the digital front-end 206 include interpolation and up conversion of transmit data received from the baseband ASIC 102A. As shown, the digital front-end 206 is coupled to an RF digital-to-analog converter (DAC) 208, which converts digital transmit data from the digital front-end 206 to an analog signal. The output of the RF DAC 208 is provided to a Digital Step Attenuator (DSA) block 210.

In the example of FIG. 2, the output of the DSA block 210 is conveyed from the transceiver circuit 104A to a PA 212, which amplifies the signal from the DSA block 210. During transmission operations, the signal output from the PA 212 is provided to an antenna 216 via a transmit/receive switch 214. The output from the PA 212 is also provided to the DPD logic 204 and/or the baseband ASIC 102A for use in DPD estimation operations by using a feedback receiver to sample the PA output. During reception operations, the signal from the antenna 216 is conveyed via the transmit/receive switch 214 to a low-noise amplifier (LNA) 218. As shown, the LNA 218 is coupled to another DSA block 220, where the output of the DSA block 220 is provided to an RF analog-to-digital converter (ADC) 222 to generate digital receive data. The digital receive data from the RF ADC 222 is provided to a digital front-end 224, which provides a communication interface to convey digital receive data to the baseband ASIC 102A.

In one example, DPD-related data transfers from the baseband ASIC 102A to the transceiver circuit 104A involve preparing data transfers, by the baseband ASIC 102A, using truncation and concatenation circuitry to truncate the total number of transmit bits (e.g., from 16 transmit data bits to 14 or less bits for each data transfer) concatenated with DPD configuration profile bits (e.g., add 2 or more DPD configuration profile bits for each of the data transfers) to replace the truncated transmit bits. In this case, the digital front-end 206 of the transceiver circuit 104A is configured to recover the DPD configuration profile from the concatenated bits included with the data transfer from the baseband ASIC 102A. Once recovered, the DPD configuration profile is available for use by DPD logic 204 to perform DPD correction operations.

In another example, DPD-related data transfers from the transceiver circuit 104A to the baseband ASIC 102A involve preparing data transfers, by the digital front-end 224, using truncation and concatenation circuitry to truncate the total number of receive bits (e.g., from 16 receive data bits to 14 or less for each data transfer) concatenated with data sample bits (e.g., add 2 or more data sample bits) to replace the truncated receive bits. In this case, the baseband ASIC 102A is configured to recover the data samples from the concatenated bits included with the data transfers from the transceiver circuit 104A. Once recovered, the data samples are available for use by the baseband ASIC 102A to perform DPD estimation operations.

In other examples, the transceiver circuit 104A is configured to perform all DPD estimation and DPD correction operations. As another alternative, the baseband ASIC 102A is able to perform all DPD estimation and DPD correction operations. In such case, the transceiver circuit 104A is able to bypass performing DPD correction operations and/or DPD estimation operations. As another alternative, DPD estimation operations are divided between the baseband ASIC 102A and the transceiver circuit 104A. As another alternative, DPD correction operations are divided between the baseband ASIC 102A and the transceiver circuit 104A. As desired, data transfers are prepared using truncation and concatenation as described herein to expedite DPD-related data transfers from the baseband ASIC 102A to the transceiver circuit 104A and/or from the transceiver circuit 104A to the baseband ASIC 102A. Another option is to supplement the expedited DPD-related data transfers of a $1^{st}$ communication interface (e.g., a JESD interface) included with the digital front-end 206 and/or the digital front-end 224 with DPD-related data transfers of a $2^{nd}$ communication interface (e.g., SPI data transfers) of the digital front-end 206 and/or the digital front-end 224.

Figure 3:
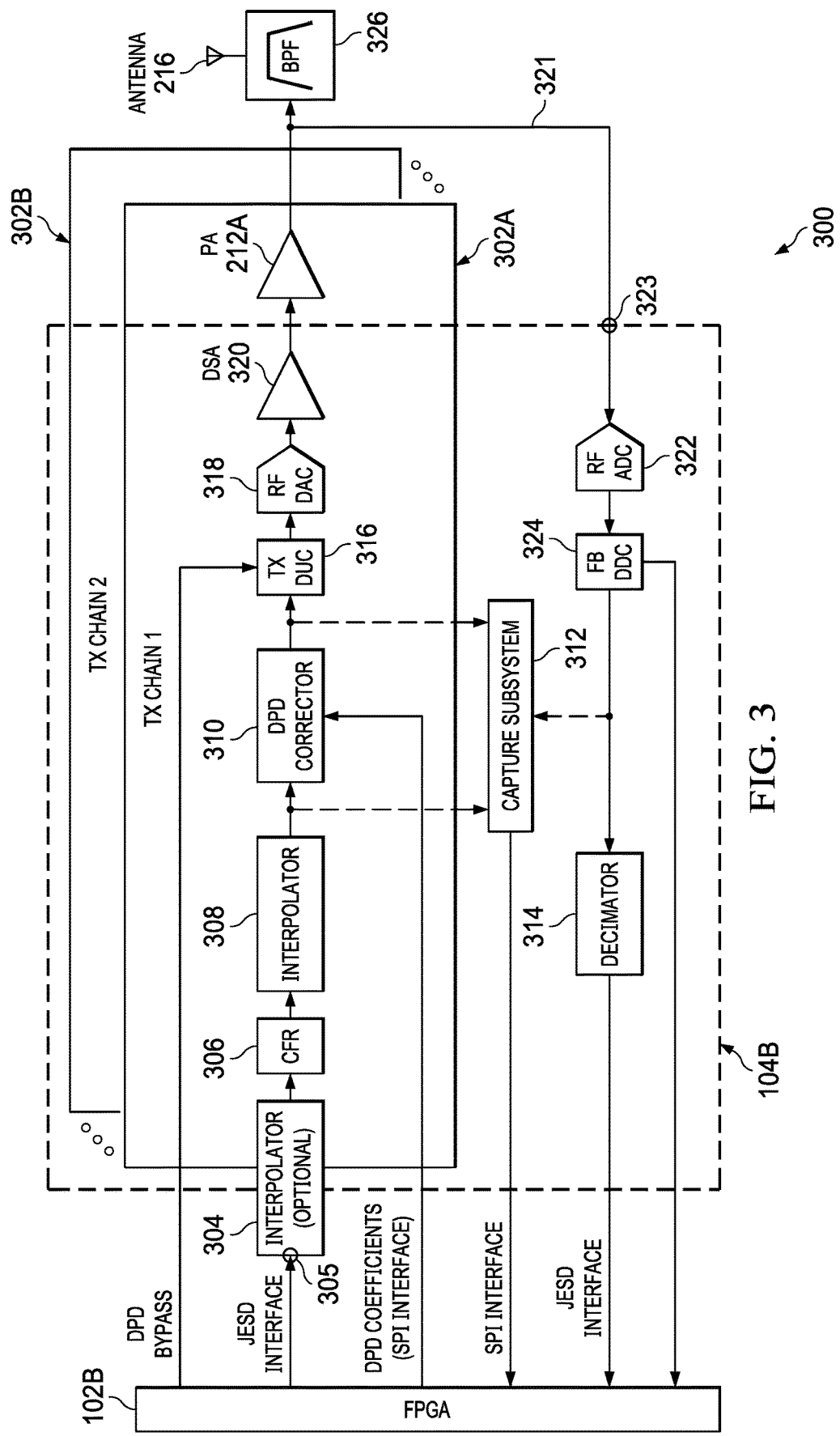
FIG. 3 is a diagram showing another system in accordance with an example embodiment.

FIG. 3 is a diagram showing another system 300 (an example of the systems 100 and 200 of FIGS. 1 and 2) in accordance with an example embodiment. In some example embodiments, the system 300 is a base station or other wireless communication device. As shown, the system 300 includes a field-programmable gate array (FPGA) 102B (an example of the host device 102 in FIG. 1, or the baseband ASIC 102A in FIG. 2) coupled to a transceiver circuit 104B (an example of the RF transceiver 104 in FIG. 1, or the transceiver circuit 104A in FIG. 2). In the example of FIG. 3, the transceiver circuit 104B includes a host device terminal 305 configured to receive communications from the FPGA 102B via a high-speed digital communications interface, such as a JESD interface.

In the example of FIG. 3, the transceiver circuit 104B includes a first transmit chain 302A coupled to the host device terminal 305, where the first transmit chain 302A includes a first optional interpolator 304 coupled to a JESD interface of the FPGA 102B, where the JESD interface is used to transmit data from the FPGA 102B to the transceiver circuit 104B. The first transmit chain 302A also includes a Crest Factor Reduction (CFR) block 306 and a second interpolator 308. As shown, the second interpolator 308 is coupled to a DPD corrector 310 configured to perform DPD correction operations on transmit data received via the JESD interface. The output of the DPD corrector 310 is provided to a transmit digital up-converter (DUC) 316. In the example of FIG. 3, an RF DAC 318 (an example of the RF DAC 208 in FIG. 2) and a DSA block 320 (an example of the DSA block 210 in FIG. 2) follow the transmit DUC 316 of the first transmit chain 302A. As shown, the output of the DSA block 320 is provided to a PA 212A (an example of the PA 212 in FIG. 2). As desired, additional transmit chains (e.g., the transmit chain 302B) are included with the transceiver circuit 104B. As shown, the outputs of the transceiver chains 302A and 302B are provided to a bandpass filter 326, which is coupled to the antenna 216.

In the example of FIG. 3, the transceiver circuit 300 also includes a capture subsystem 312 configured to capture data samples before the DPD corrector 310 and after the DPD corrector 310. The capture subsystem 312 is also configured to capture data samples from a feedback path that extends from the PA 212A. Specifically, the output 321 from the PA 212A is fed back to the transceiver circuit 300 via a PA terminal 323 coupled to feedback path components such as an RF ADC 322 and a feedback data down-converter (FB DDC) 324, where the capture subsystem 312 obtains data samples at the output of the FB DDC 324. In some examples, the data samples at the input of the DPD corrector 310, the data samples at the output of the DPD corrector 310, and the data samples at the output of the FB DDC 324 are captured simultaneously. Also represented in FIG. 3 is a decimator 314 coupled to the FB DDC 324.

As represented in FIG. 3, between the decimator 314 and the FPGA 102A is another JESD interface, which is used to transfer data from the transceiver circuit 104B to the FPGA 102B. Another communication interface is represented between the FB DDC 324 and the FPGA 102B to enable data transfers from the FB DDC 324 to the FPGA 102B. Also, an SPI interface is represented between the DPD corrector 310 and the FPGA 102A, where the SPI interface is used to transfer DPD configuration profile data in the form of DPD coefficients from the FPGA 102B to the DPD corrector 310. Also, an SPI interface is represented between the capture subsystem 312 and the FPGA 102A, where the SPI interface is used to transfer data samples from the captured subsystem 312 to the FPGA 102B.

In one example, DPD-related data transfers from the FPGA 102B to the transceiver circuit 104B involve preparing data transfers, by the FPGA 102B, using truncation and concatenation circuitry to truncate the total number of transmit bits (e.g., from 16 transmit data bits to 14 or less bits for each data transfer) concatenated with DPD configuration profile bits (e.g., add 2 or more DPD configuration profile bits for each of the data transfers) to replace the truncated transmit bits. In this example, data transfers from the FPGA 102B to the transceiver circuit 104B are performed via the JESD interface (between the FPGA 102B and the interpolator 304). The transceiver circuit 104B is configured to recover the DPD configuration profile from the concatenated bits included with the data transfers from the FPGA 102B. Once recovered, the DPD configuration profile is available for use by the DPD corrector 310 to perform DPD correction operations.

In another example, DPD-related data transfers from the transceiver circuit 104B to the FPGA 102B involve preparing data transfers, by the transceiver circuit 104B, using truncation and concatenation circuitry to truncate the total number of receive bits (e.g., from 16 receive data bits to 14 or less for each data transfer) concatenated with data sample bits (e.g., add 2 or more data sample bits) to replace the truncated receive bits. In this example, data transfers from the transceiver circuit 104B to the FPGA 102B are performed via the JESD interface (between the decimator 314 and the FPGA 102B). The FPGA 102B is configured to recover the data samples from the concatenated bits included with the data transfers from the transceiver circuit 104B. Once recovered, the data samples are available for use by the FPGA 102B to perform DPD estimation operations.

In other examples, the transceiver circuit 104B is configured to perform all DPD estimation and DPD correction operations. As another alternative, the FPGA 102A is able to perform all DPD estimation and DPD correction operations. In such case, the transceiver circuit 104B is able to bypass performing DPD correction operations and/or DPD estimation operations (e.g., as signaled by the DPD bypass from the FPGA 102B). As another alternative, DPD estimation operations are divided between the FPGA 102B and the transceiver circuit 104B. As another alternative, DPD correction operations are divided between the FPGA 102B and the transceiver circuit 104B. As desired, data transfers are prepared using truncation and concatenation as described herein to expedite DPD-related data transfers from the FPGA 102B to the transceiver circuit 104B and/or from the transceiver circuit 104B to the FPGA 102B. Another option is to supplement the expedited DPD-related data transfers of a $1^{st}$ communication interface (e.g., a JESD interface) included with the FPGA 102B and the transceiver circuit 104B with DPD-related data transfers of a $2^{nd}$ communication interface (e.g., SPI data transfers) of the included with the FPGA 102B and the transceiver circuit 104B.

With the transceiver circuit 104B, the DPD LUT configuration data used by the DPD corrector 310 needs to re-configured periodically as part of DPD iterations and DPD tracking. For every reconfiguration as much as 50 KB of LUT data is transferred from FPGA 102B to the transceiver circuit 104B. For every iteration of DPD estimation, data is synchronously captured at different tap off points in the chain including the input of the DPD corrector 310, the output of the DPD corrector 310, and the feedback path output from FB DDC 324. In some scenarios, the captured data blocks need to be transferred back to the FPGA 102B, where every transfer involves about 96 KB of data.

Figure 4C:
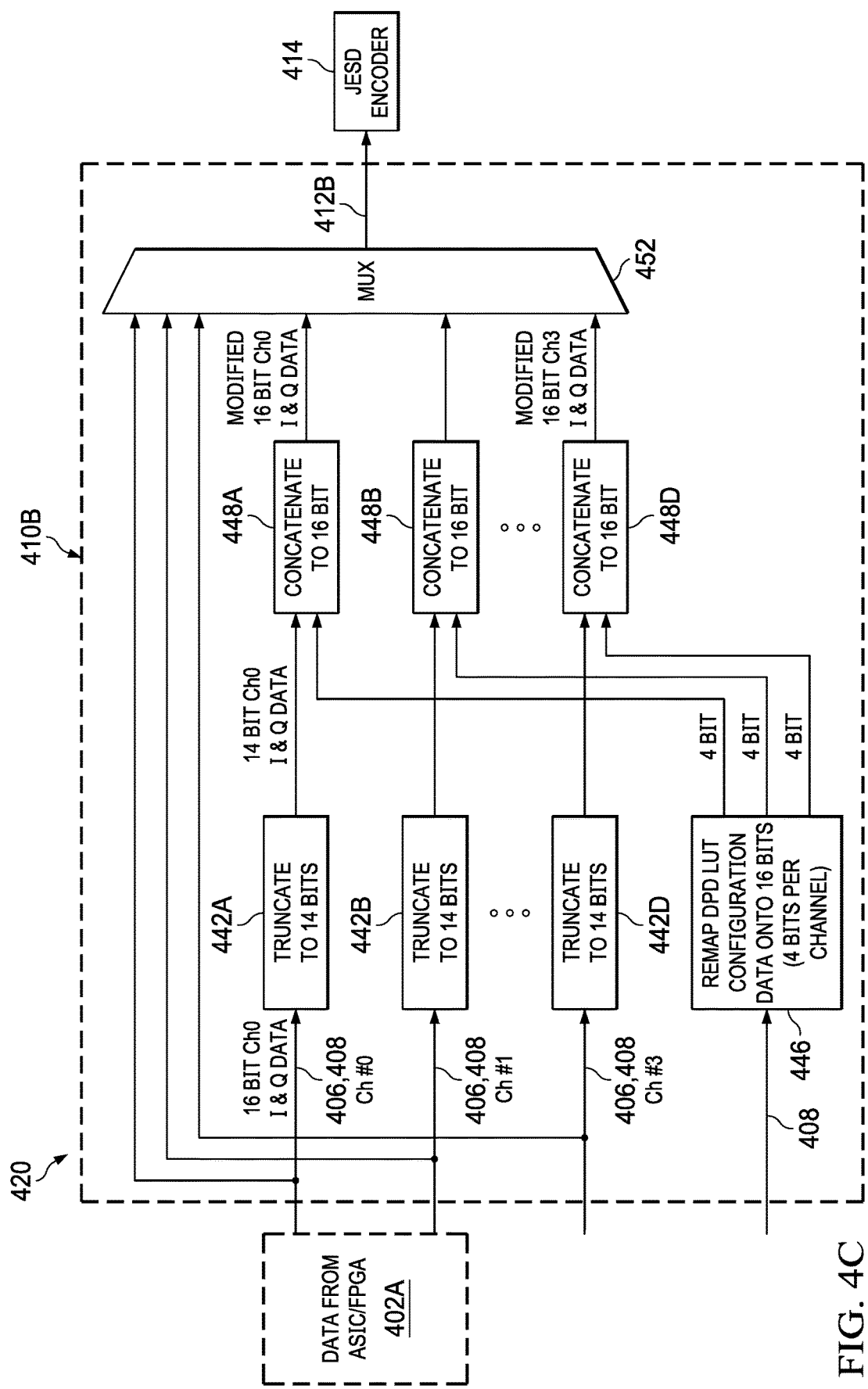

FIGS. 4A-4C are diagrams showing DPD configuration profile data encoding options 400, 420, and 440 in accordance with example embodiments. In the DPD configuration profile data encoding option 400 of FIG. 4A, truncate and concatenate circuitry 410 is represented, where the truncate and concatenate circuitry 410 receives data 402 from an ASIC/FPGA (e.g., the baseband ASIC 102A in FIG. 2, or the FPGA 102B in FIG. 3). Specifically, the data 402 includes I data 404 and Q data 406 in FIG. 4A. The truncate and concatenate circuitry 410 also receives DPD configuration data 408 (e.g., resulting from DPD estimation operations) from the ASIC/FPGA. In operation, the truncate and concatenate circuitry 410 prepares data transfers so that the total number of I and Q transmit bits is truncated (e.g., from 16 I transmit bits to 14 or less I transmit bits, and from 16 Q transmit bits to 14 or less Q transmit bits for each data transfer) and so that DPD configuration profile bits are concatenated (e.g., add 4 or more DPD configuration profile bits for each data transfer) to replace the truncated I and Q transmit bits. The output of the truncate and concatenate circuitry 410 includes prepared data transfers 412 with the DPD configuration data 408. In the example of FIG. 4A, the prepared data transfers 412 are provided to a JESD encoder 414 for JESD encoding operations. The output 416 of the JESD encoder 414 is transferred to a transceiver such as the RF transceiver 102 in FIG. 1, the transceiver circuit 102A in FIG. 2, or the transceiver circuit 102B in FIG. 3.

As described herein for some scenarios, feedback baseband data is transferred from a transceiver circuit to an host device (e.g., a host processor, a baseband ASIC, or an FPGA). The baseband data is typically 16-bit complex (real and imaginary) data, and example baseband rates include 122.88, 245.76, 368.64, and 491.52 MSPS. For example, for a baseband data rate of 245.76 MSPS, the overall bit rate required is $245.76*1e^6*16*2*(10/8)=9.83$ Gbps. In some examples, transmit baseband data is 16-bit wide, but 14 or 15-bit data is sufficient for preserving the signal quality. Hence, 1 or 2 least significant bits (LSBs) of the 16-bit data can be replaced with DPD configuration data updates (from the host device to the transceiver circuit) or data samples (from the transceiver circuit to the host device) used for DPD estimation. The use of LSBs provide a high-speed communication pipe between the transceiver circuit and the host device.

In the DPD configuration profile data encoding option 420 of FIG. 4B, truncate and concatenate circuitry 410A (an example of the truncate and concatenate circuitry 410 in FIG. 4A is represented), where the truncate and concatenate circuitry 410A receives the data 402 from an ASIC/FPGA (e.g., the baseband ASIC 102A in FIG. 2, or the FPGA 102B in FIG. 3). Again, the data 402 includes I data 404 and Q data 406. The truncate and concatenate circuitry 410A also receives the DPD configuration data 408 (e.g., resulting from DPD estimation operations) from the ASIC/FPGA. In operation, the truncate and concatenate circuitry 410A prepares data transfers using a truncation operation 422 that truncates 16 bit I data to 14 bits, and using a truncation operation 424 that truncates 16 bit Q data to 14 bits. The truncate and concatenate circuitry 410A also performs operations 426 to remap DPD LUT configuration data onto 4 bits. The bits output from the operations 422, 424, and 426 are combined using concatenation operations 428 (14 bit I data+2 bits of DPD LUT configuration data) and concatenation operations 430 (14 bit Q data+2 bits of DPD LUT configuration data). The output of the concatenation operations 428 is modified 16 bit I data that includes 2 bits of DPD LUT configuration data. Also, the output of the concatenation operations 430 is modified 16 bit Q data that includes 2 bits of DPD LUT configuration data. The modified 16 bit I data and the modified 16 bit Q data is provided to a multiplexer 432 that selects when to transmit the modified 16 bit I data and the modified 16 bit Q data versus unmodified 16 bit I data and unmodified 16 bit Q data. As shown in FIG. 4B, the output 412A (an example of the output 412 in FIG. 4A) from the multiplexer 432 is provided to the JESD encoder 414.

With the DPD configuration profile data encoding option 420 of FIG. 4B, DPD LUT configuration data is remapped into a stream of 4 bits split into 2 streams of 2 bits each. The 16 bit complex baseband data is truncated (or rounded) to 14 bits and concatenated with the DPD LUT configuration streams to convert it back to 16 bit data which is sent to the JESD encoder 414 to transmit the data out of the host device, baseband ASIC, or FPGA through SERDES lanes.

In the DPD configuration profile data encoding option 440 of FIG. 4C, truncate and concatenate circuitry 410B (an example of the truncate and concatenate circuitry 410 in FIG. 4A is represented), where the truncate and concatenate circuitry 410B receives data 402A from an ASIC/FPGA (e.g., the baseband ASIC 102A in FIG. 2, or the FPGA 102B in FIG. 3). In the example of FIG. 4C, the data 402A includes 16 bit I data 406 and 16 bit Q data 408 for multiple channels (e.g., channels 0-3). The truncate and concatenate circuitry 410B also receives the DPD configuration data 408 (e.g., resulting from DPD estimation operations) from the ASIC/FPGA. In operation, the truncate and concatenate circuitry 410B prepares data transfers using truncation operations 442A-442D to truncate 16 bit I data to 14 bits and to truncate 16 bit Q data to 14 bits for each of the channels 0-3. The truncate and concatenate circuitry 410B also performs operations 446 to remap DPD LUT configuration data onto 4 bits for each channel. The bits output from the operations 442A-442D and 446 are combined using concatenation operations 448A-448D (14 bit I data+2 bits of DPD LUT configuration data, 14 bit Q data+2 bits of DPD LUT configuration data for each of the channels 0-3). The output of the concatenation operations 448A-448D is modified 16 bit I data that includes 2 bits of DPD LUT configuration data and modified 16 bit Q data that includes 2 bits of DPD LUT configuration data for each of the channels 0-3. The modified 16 bit I data and the modified 16 bit Q data for each of the channels 0-3 is provided to a multiplexer 452 that selects when to transmit the modified 16 bit I data and the modified 16 bit Q data for each of the channels 0-3 versus unmodified 16 bit I data and unmodified 16 bit Q data for each of the channels 0-3. As shown in FIG. 4C, the output 412B (an example of the output 412 in FIG. 4A) from the multiplexer 452 is provided to the JESD encoder 414. In some examples, transceiver chips have multiple transmit chains and feedback chains (e.g., 4 or 8 transmit chains and 2 feedback chains), where LSBs of baseband data are used from all transmit chains to send DPD LUT configuration data of a particular channel. This will speed up the transfer of the DPD configuration data compared to using a single transmit chain.

FIG. 5A is a diagram showing a frame structure 500 for data transfers to convey DPD configuration profile data from a host device (e.g., a host processor, the host device 102 in FIG. 1, the baseband ASIC 102A in FIG. 2, or the FPGA 102B in FIG. 3) to a transceiver circuit (e.g., the RF transceiver 104 in FIG. 1, the transceiver circuit 104A in FIG. 2, or the transceiver circuit 104B in FIG. 3) in accordance with an example embodiment. In some examples, a similar frame structure is used for data transfers from a transceiver circuit to a host device. As shown in FIG. 5A, the frame structure 500 includes a first set of zeros 502, a header 504, DPD configuration profile data 506, a cyclic redundancy check 508, and a second set of zeros 510. When there is no frame to be transmitted, zeros are transmitted. For DPD configuration data transfers, 1 or 2 LSBs of 16 bit transmit baseband data is used to transfer the DPD configuration profile data (from the host device to the transceiver circuit), resulting in a 14 or 15 bit transmit data stream and a 1 or 2 bit stream for the DPD configuration data.

FIG. 5B is a diagram showing a frame structure 520 for data transfers to convey data samples from a transceiver circuit (e.g., the RF transceiver 104 in FIG. 1, the transceiver circuit 104A in FIG. 2, or the transceiver circuit 104B in FIG. 3) to a host device (e.g., the host device 102 in FIG. 1, the baseband ASIC 102A in FIG. 2, or the FPGA 102B in FIG. 3) in accordance with an example embodiment. As shown in FIG. 5B, the frame structure 520 is similar to the frame structure 500 of FIG. 5A. Specifically, the frame structure 520 includes a first set of zeros 502, a header 504, data sample bits 522, a cyclic redundancy check 508, and a second set of zeros 510. When there is no frame to be transmitted, zeros are transmitted. For data sample data transfers, 1 or 2 LSBs of 16 bit receive data is used to transfer data sample data (from a transceiver circuit to a host device), resulting in a 14 or 15 bit receive data stream and a 1 or 2 bit stream for the data sample data.

Figure 6B:
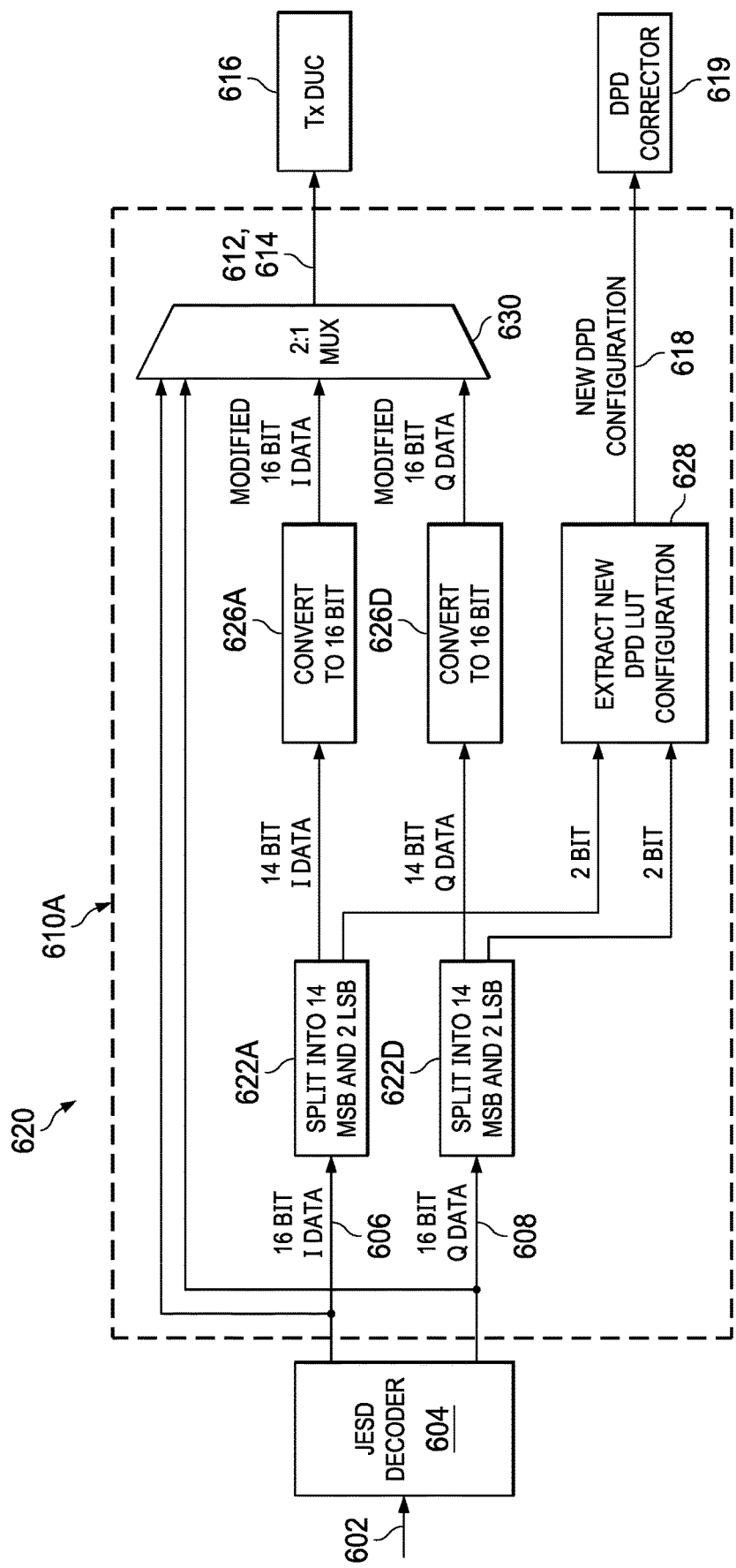
Figure 6C:
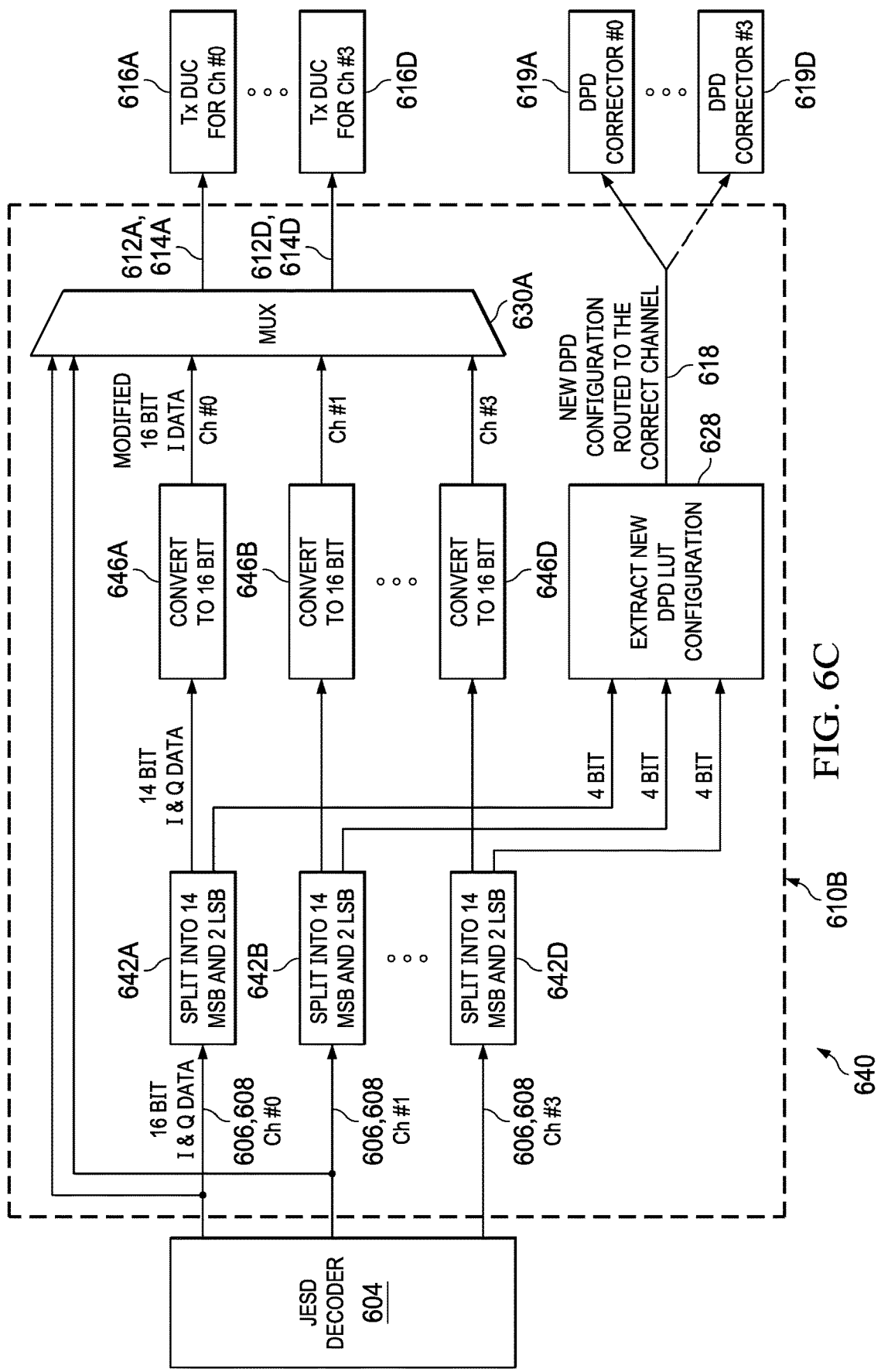

FIGS. 6A-6C are diagrams showing DPD configuration profile data transfer decoding options 600, 620, and 640 in accordance with example embodiments. In the DPD configuration profile data decoding option 600 of FIG. 6A, DPD data extraction circuitry 610 is represented, where the DPD data extraction circuitry 610 receives I data 606 and Q data 608 from a JESD decoder 604 (e.g., part of a transceiver circuit) that receives input data 602. The DPD data extraction circuitry 610 is configured to extract DPD configuration profile data 618 from the I data 606 and Q data 608, where the extracted DPD configuration profile data 618 is provided to a DPD corrector (e.g., the DPD corrector 310 of FIG. 3, the DPD logic 204 in FIG. 2, or related circuitry in FIG. 1). The remaining I data 612 and the remaining Q data 614 are provided to a transmit DUC 616 (an example of the transmit DUC 316 in FIG. 3) to continue transmission operations.

In the DPD configuration profile data decoding option 620 of FIG. 6B, the external components (e.g., the JESD decoder 604, the transmit DUC 616 and the DPD corrector 619) relative to the DPD data extraction circuitry 610A (an example of the DPD data extraction circuitry 610 in FIG. 6A) remain the same as in FIG. 6A. In FIG. 6B, additional details for the DPD data extraction circuitry 610A are represented. Specifically, the I data 606 and the Q data 608 from the JESD decoder 604 are split into 14 most significant bits (MSBs) and 2 least significant bits (LSBs) by operations 622A and 622B. The result of the operation 622A is 14 bit I data and 2 bits of DPD LUT configuration data. Similarly, the result of the operation 622B is 14 bit Q data and 2 bits of DPD LUT configuration data. The 14 bit I data is converted to 16 bit I data by operations 626A. Also, the 14 bit Q data is converted to 16 bit Q data by operations 626B. The outputs of the operations 626A and 626B are modified 16 bit I data and modified 16 bit Q data provided to a multiplexer 630 that selects between the modified 16 bit I data and the modified 16 bit Q data versus the 16 bit I data 606 and the 16 bit Q data 608 from the JESD decoder 604. Also, the operations 628 are used to recover new DPD LUT configuration data 618 from the bits extracted by the operations 622A and 622B. The new DPD LUT configuration data 618 is provided to the DPD corrector 619.

In the DPD configuration profile data decoding option 640 of FIG. 6C, the DPD data extraction circuitry 610B (an example of the DPD data extraction circuitry 610 in FIG. 6A) is compatible with a multi-channel scenario. More specifically, the JESD decoder 604 outputs 16 bit I data 606 and 16 bit Q data 608 for multiple channels 0-3. The operations 642A-642D splits the 16 bit I data 606 and the 16 bit Q data 608 for each of the channels 0-3 into 14 MSBs and 2 LSBs. The 14 bits I data and the 14 bit Q data are output from the operations 642A-642D. Subsequently, operations 646A-646D are performed to convert the 14 bit I data and the 14 bit Q data for each of the channels 0-3 to 16 bit I data and 16 bit Q data for each of the channels 0-3. The outputs of the operations 646A-646D are modified 16 bit I data and modified 16 bit Q data for each of the channels 0-3, which are provided to a multiplexer 630A (an example of the multiplexer 630 in FIG. 6A) that selects between the modified 16 bit I data and the modified 16 bit Q data for each of the channels 0-3 versus the 16 bit I data 606 and the 16 bit Q data 608 from the JESD decoder 604 for each of the channels 0-3. For each of the channels 0-3, the multiplexer 630A is configured to provide a respective set of I data 612A-612D and Q data 614A-614D to transmit DUCs 616A-616D for each of the channels 0-3. Also, the operations 628 are used to recover new DPD LUT configuration data 618 from the bits extracted by the operations 642A-642D. The new DPD LUT configuration data 618 is provided to DPD correctors 619A-619D for each of the channels 0-3.

With the described solution, DPD-related data transfers allows up to ~100× faster reconfiguration of DPD as well as fast transfer of captured data compared to SPI. This leads to a lower DPD iteration time and hence lower DPD convergence time. The described solution is applicable for both zero-IF and RF sampling based transceiver architectures. With the described solution, existing resources of SERDES lanes are used for transfer of data between ICs as described herein.

The described examples involves use of a high speed JESD interface for transfer of DPD LUT configuration data from a first IC that performs DPD estimation to a second IC that performs DPD correction. In some examples, the 16-bit JESD interface is shared between ASIC/FPGA and a transmit chain of a transceiver circuit to transfer DPD configuration. In one example, 14-bits of the 16-bit data are used for TX baseband data and 2 bits are used for DPD configuration profile data. Also, the JESD interface can be used to transfer data samples from the second IC to the first IC. As desired, the 16-bit JESD interface is shared between an FB chain and a host device to transfer data samples. In one example, 14 bits are used for FB data and 2 bits are used for data sample bits. In some examples, the data samples include synchronous data samples of DPD correction input, DPD correction output, and FB baseband output data. In some examples, the frame structure including a header and CRC to identify the DPD LUT configuration profile data whenever it is sent. In some example embodiments, instead of a JESD interface, another high speed digital interfaces, such as a low-voltage differential signaling (LVDS) interface, is used.

The term "couple" is used throughout this description. The term may cover connections, communications, or signal paths that enable a functional relationship consistent with this description. For example, if device A generates a signal to control device B to perform an action, in a first example device A is coupled to device B by direct connection, or in a second example device A is coupled to device B through intervening component C if intervening component C does not alter the functional relationship between device A and device B such that device B is controlled by device A via the control signal generated by device A.

Modifications are possible in the described embodiments, and other embodiments are possible, within the scope of the claims.

What is claimed is:

1. A system, comprising:
a host processor;
a transceiver coupled to the host processor;
a power amplifier coupled to an output of the transceiver, wherein the transceiver is configured to:
 perform DPD correction operations on transmit data received from the host processor;
 output corrected transmit data based on the performed DPD correction operations; and
 generate an analog transmit signal based on the corrected transmit data;
wherein the transceiver includes data sampling logic configured to capture data samples of: feedback from an output of the power amplifier; an input to DPD logic of the transceiver; and an output from the DPD logic;
wherein the transceiver includes:
a receive chain; and
a communication interface coupled between the receive chain and the host processor, wherein the communication interface is configured to prepare data transfers, each of the prepared data transfers including a truncated set of receive data bits concatenated with bits of the data samples.

2. A system, comprising:
a host processor;
a transceiver coupled to the host processor;
a power amplifier coupled to an output of the transceiver, wherein the transceiver is configured to:
 perform DPD correction operations on transmit data received from the host processor;
 output corrected transmit data based on the performed DPD correction operations; and
 generate an analog transmit signal based on the corrected transmit data;
wherein the transceiver includes data sampling logic configured to capture data samples of: feedback from an output of the power amplifier; an input to DPD logic of the transceiver; and an output from the DPD logic;
wherein the transceiver includes:
 DPD logic configured to perform the DPD correction operations; and
 a communication interface coupled between the DPD logic and the host processor, wherein the communication interface is configured to:
  extract a DPD configuration profile from data transfers received from the host processor; and
  provide the extracted DPD configuration profile to the DPD logic, wherein each of the data transfers includes a truncated set of transmit data bits concatenated with bits of the DPD configuration profile.

3. The system of claim 2, wherein the communication interface is configured to extract the DPD configuration profile from a data transfer structure that includes a first set of zeroes, a header, DPD configuration data bits, a cyclic redundancy check (CRC) bit, and a second set of zeros.

4. The system of claim 2, wherein the transceiver comprises a plurality of channels, and wherein the communication interface is configured to extract the DPD configuration profile from I and Q data conveyed by the plurality of channels.

5. The system of claim 2, wherein the communication interface is a JESD interface.

6. A transceiver circuit, comprising:
a communication interface;
an interpolator coupled to the communication interface;
digital pre-distortion (DPD) logic coupled to the interpolator;
a transmit chain coupled to an output of the DPD logic;
further comprising a host device terminal, wherein the DPD logic is configured to:
 receive transmit data from the host device terminal;
 perform DPD correction operations on the received transmit data; and
 output corrected transmit data to the transmit chain based on the performed DPD correction operations;
a power amplifier terminal adapted to receive a power amplifier output signal;
a feedback path coupled to the power amplifier terminal; and
data sampling logic coupled to the DPD logic and the feedback path, wherein the data sampling logic is configured to capture data samples of:
 feedback data from the feedback path;
 the transmit data input to the DPD logic;
 the corrected transmit data output from the DPD logic;
wherein the transceiver circuit includes a receive chain coupled to the communication interface, wherein the communication interface is configured to prepare data transfers, each of the prepared data transfers including a truncated set of receive data bits from the receive chain concatenated with bits of the captured data samples.

7. A transceiver circuit, comprising:
a communication interface;
an interpolator coupled to the communication interface;
digital pre-distortion (DPD) logic coupled to the interpolator;
a transmit chain coupled to an output of the DPD logic;
further comprising a host device terminal, wherein the DPD logic is configured to:
 receive transmit data from the host device terminal;
 perform DPD correction operations on the received transmit data; and
 output corrected transmit data to the transmit chain based on the performed DPD correction operations;
a power amplifier terminal adapted to receive a power amplifier output signal;
a feedback path coupled to the power amplifier terminal; and
data sampling logic coupled to the DPD logic and the feedback path, wherein the data sampling logic is configured to capture data samples of:
 feedback data from the feedback path;
 the transmit data input to the DPD logic;
 the corrected transmit data output from the DPD logic;

further comprising a host device terminal, wherein the communication interface is coupled to the host device terminal and is configured to:
extract a DPD configuration profile from data transfers received from the host device terminal; and
provide the extracted DPD configuration profile to the DPD logic, wherein each of the data transfers includes a truncated set of transmit data bits concatenated with bits of the DPD configuration profile.

8. The transceiver circuit of claim 7, wherein the communication interface is configured to extract the DPD configuration profile from a data transfer structure that includes a first set of zeroes, a header, DPD configuration data bits, a cyclic redundancy check (CRC) bit, and a second set of zeros.

9. The transceiver circuit 7, further comprising a plurality of channels, and wherein the communication interface is configured to extract the DPD configuration profile from I and Q data streams conveyed by the plurality of channels.

10. An integrated circuit, comprising:
a host device terminal;
a communication interface coupled to the host device terminal;
digital pre-distortion (DPD) logic coupled to the communication interface; and
a transmit chain coupled to an output of the DPD logic, wherein the DPD logic is configured to perform DPD correction operations on transmit data received from the host device terminal;
wherein the communication interface is configured to:
encode data transfers with:
first data samples from a feedback path adapted to provide power amplifier output feedback data;
second data samples of transmit data input to the DPD logic; and
third data samples of corrected transmit data output from the DPD logic;
and
transmit the encoded data transfers to the host device terminal, each of the encoded data transfer including a truncated set of receive data bits concatenated with bits of the first, second, or third data samples.

11. An integrated circuit, comprising:
a host device terminal;
a communication interface coupled to the host device terminal;
digital pre-distortion (DPD) logic coupled to the communication interface; and
a transmit chain coupled to an output of the DPD logic, wherein the DPD logic is configured to perform DPD correction operations on transmit data received from the host device terminal;
wherein the communication interface is configured to:
receive data transfers from the host device terminal, wherein each of the received data transfers incudes a truncated set of transmit data bits concatenated with bits of DPD configuration data;
decode the DPD configuration data from the data transfers; and
provide the decoded DPD configuration data to the DPD logic, wherein the DPD logic is configured to use the decoded DPD configuration data to perform subsequent DPD correction operations.

* * * * *